(12) United States Patent
Cohen et al.

(10) Patent No.: US 9,178,293 B2
(45) Date of Patent: Nov. 3, 2015

(54) CORD PLATE

(75) Inventors: Brian E. Cohen, Perrysburg, OH (US); Raymond Domsic, Grosse Ile, MI (US)

(73) Assignee: First Solar, Inc., Perrysburg, OH (US)

( * ) Notice: Subject to any disclaimer, the term of this patent is extended or adjusted under 35 U.S.C. 154(b) by 1010 days.

(21) Appl. No.: 12/879,906

(22) Filed: Sep. 10, 2010

(65) Prior Publication Data
US 2011/0061712 A1 Mar. 17, 2011

Related U.S. Application Data (60) Provisional application No. 61/241,589, filed on Sep. 11, 2009.

(51) Int. Cl.
| | |
|---|---|
| *H01L 31/042* | (2014.01) |
| *H01R 12/53* | (2011.01) |
| *H01L 31/02* | (2006.01) |
| *H01R 13/58* | (2006.01) |
| *H02G 15/10* | (2006.01) |
| *H01R 13/52* | (2006.01) |

(52) U.S. Cl.
CPC .......... *H01R 12/53* (2013.01); *H01L 31/02008* (2013.01); *H01R 13/5833* (2013.01); *H02G 15/10* (2013.01); *H01R 13/5216* (2013.01); *Y02E 10/50* (2013.01); *Y10T 29/49208* (2015.01)

(58) Field of Classification Search
CPC ............... H02G 15/10; H01R 13/5833; Y10T 29/49208; H01L 31/02008; H02S 40/30; H02S 40/34
USPC .......................................... 136/293, 243–265
See application file for complete search history.

(56) References Cited

U.S. PATENT DOCUMENTS

| | | | | |
|---|---|---|---|---|
| 6,127,620 | A * | 10/2000 | Tange et al. .................... | 136/246 |
| 6,344,612 | B1 | 2/2002 | Kuwahara et al. | |
| 6,462,265 | B1 * | 10/2002 | Sasaoka et al. ................ | 136/251 |
| 6,930,246 | B1 * | 8/2005 | Blundo ........................... | 174/50 |
| 2005/0054219 | A1 | 3/2005 | Werner et al. | |
| 2005/0236031 | A1 | 10/2005 | Higashikozono et al. | |
| 2006/0180196 | A1 | 8/2006 | Lares et al. | |
| 2008/0041434 | A1 * | 2/2008 | Adriani et al. ................. | 136/244 |
| 2008/0078440 | A1 * | 4/2008 | Lim et al. ....................... | 136/251 |
| 2008/0264471 | A1 | 10/2008 | Hayes | |
| 2010/0170715 | A1 * | 7/2010 | Grimberg et al. ............. | 174/547 |

FOREIGN PATENT DOCUMENTS

| | | |
|---|---|---|
| CN | 1166008 C | 9/2004 |
| CN | 1578035 A | 2/2005 |
| CN | 101138098 A | 3/2008 |
| WO | WO 2006/086588 A1 | 8/2006 |

* cited by examiner

*Primary Examiner* — Allison Bourke
*Assistant Examiner* — Niki Bakhtiari
(74) *Attorney, Agent, or Firm* — Dickstein Shapiro LLP (57) ABSTRACT

A photovoltaic module cord plate is disclosed. The cord plate has a base and channel.

22 Claims, 6 Drawing Sheets

CORD PLATE

CLAIM OF PRIORITY

This application claims priority to U.S. Provisional Patent Application No. 61/241,589, filed on Sep. 11, 2009, which is incorporated herein by reference in its entirety.

TECHNICAL FIELD

This invention relates to a photovoltaic module cord plate having a base and channel.

BACKGROUND

One challenge in solar energy industry has been to maintain an effective electrical connection between the output/input wire and the photovoltaic module after being exposed to varying environmental factors, such as temperature, humidity, sun exposure, or combinations thereof.

DETAILED DESCRIPTION

To maintain an electrical connection between the output/input wire and the photovoltaic module, a new cord plate has been developed that permits securing and electrically connecting the output/input wire to the photovoltaic module and introducing a sealant into the cord plate. With the new design of cord plate, a three-point support can be used to secure the wire. Moreover, the sealant fills in the cord plate without cavity and contacts the cord plate and the cover plate, eventually curing to form a robust adhesive bond between the cord plate and the photovoltaic module and further secure the electrical connection.

In one aspect, a photovoltaic module cord plate may include a base including a top surface and a bottom surface. The cord plate can be configured to be mounted to a surface of a photovoltaic module cover plate by positioning the bottom surface adjacent to the surface of the photovoltaic module. The cord plate can include a junction on the top surface of the base configured to intersect a first conductor and a second conductor. The junction may include an opening formed in the base and a channel extending from the opening and configured to position the first conductor to be electrically connected to the second conductor. The cord plate can include an arch adjacent to the channel configured to receive the second conductor into the channel. The cord plate can include a cradle adjacent to the arch configured to receive the second conductor into the arch. The cord plate can include a conductor support adjacent to the cradle and configured to receive the second conductor into the cradle. The conductor support can be colinear to the arch and the cradle, and the arch, the cradle, and the conductor support can form a wire path from the perimeter of the base to the channel, configured to secure the second conductor and keep it straight with respect to the cord plate.

The conductor support may include a second arch extending perpendicular from the top surface of the base. The arch may include an inner diameter less than 3 mm greater than the diameter of a second conductor. The top surface of the base has an outer edge and the conductor support may include an arch extending perpendicular from the top surface's outer edge of the base. The bottom surface of the base may include a primer. The channel may include an opening in the base. The base has a thickness of about 2 mm to about 10 mm. The base has a thickness of about 5 mm. The cord plate may include plastic. The cord plate may include polycarbonate. The base may include a substantially rectangular plate. The base may include a recess formed in the bottom surface. The cord plate can further include a rib extending along the length of the top surface of the base, substantially perpendicular to the wire path. The cord plate can further include a second arch, a second cradle, and a second conductor support, wherein the second arch, the second cradle, and the second conductor support are colinear and define a second wire path configured to receive a third conductor into the channel at a point on the side of the channel opposite the from the first wire path, and configured to secure the third conductor and keep it straight with respect to the cord plate. The cord plate can further include a wire anchor formed in the rib, configured to secure the second conductor in a loop from the first wire path to a position adjacent and perpendicular to the second wire path. Each arch, independently, can be a semicircle, square, rectangle or a triangle.

In one aspect, a method of manufacturing a photovoltaic module can include positioning a first conductor adjacent to a cover plate of a photovoltaic device. The conductor can include a first end configured to be connected to the photovoltaic device. The conductor can include a second end located proximate to a connector on a first surface of the cover plate. The method can include positioning a cord plate on the first surface of the cover plate over the connector. The cord plate can include a base including a top surface and a bottom surface, wherein the cord plate is configured to be mounted to a surface of a photovoltaic module cover plate by positioning the bottom surface adjacent to the surface of the photovoltaic module. The cord plate can include a junction on the top surface of the base configured to intersect a first conductor and a second conductor, wherein the junction may include an opening formed in the base and a channel extending from the opening and configured to position the first conductor to be electrically connected to the second conductor. The cord plate can include an arch adjacent to the channel configured to receive the second conductor into the channel. The cord plate can include a cradle adjacent to the arch configured to receive the second conductor into the arch. The cord plate can include a conductor support adjacent to the cradle. The cord plate can be configured to receive the second conductor into the cradle. The conductor support can be colinear to the arch and the cradle. The arch, the cradle, and the conductor support can form a wire path from the perimeter of the base to the channel, configured to secure the second conductor and keep it straight with respect to the cord plate.

The method can include inserting the second conductor to the channel by moving it along the wire path, proximate to the arch, the cradle, and the conductor support to position a portion of the second conductor proximate to the first conductor. The method can include electrically connecting the second conductor to the first conductor.

The method can further include the steps of introducing a flowable sealant into the channel, causing the flowable sealant to contact the channel and cover plate, and fill a portion of a solder cavity positioned inside the channel, and curing the flowable sealant to connect the cord plate to the cover plate. The method can further include the step of priming the bottom surface of the base before positioning on the cover plate. The bottom surface of the base is primed with a liquid primer. The bottom surface of the base is primed with flame treatment. The method can further include the step of positioning a seal on the first surface of the cover plate over the connector before positioning the cord plate on the first surface of the cover plate over the connector. The seal may include an acrylic foam core. The seal may include a pressure sensitive adhesive on a surface of the acrylic foam core. The first conductor and the second conductor are connected by soldering. The second conductor may include insulated electrical wiring configured to carry electrons either to or from the first conductor. The first conductor may include a conductive foil strip.

The conductor support may include a second arch extending perpendicular from the top surface of the base. The top surface of the base has an outer edge and the conductor support may include an arch extending perpendicular from the top surface's outer edge of the base. The sealant may include a silicone. The sealant may include an acrylic. The sealant may include a polysulfide. The sealant may include a butyl polymer. The sealant may include a polyurethane. The sealant may include a room-temperature vulcanization sealant. The cord plate may include plastic. The cord plate may include polycarbonate. The cord plate can further include a rib extending along the length of the top surface of the base, substantially perpendicular to the wire path. The cord plate can further include a second arch, a second cradle, and a second conductor support, wherein the second arch, the second cradle, and the second conductor support are colinear and define a second wire path configured to receive a third conductor into the channel at a point on the side of the channel opposite the from the first wire path, and configured to secure the third conductor and keep it straight with respect to the cord plate. The cord plate can further include a wire anchor formed in the rib, configured to secure the second conductor in a loop from the first wire path to a position adjacent and perpendicular to the second wire path. The method can further include the step of connecting the second conductor to the wire anchor such that the second conductor forms a loop from the first wire path to a position adjacent and perpendicular to the second wire path. Each arch, independently, can be a semicircle, square, rectangle or a triangle.

In one aspect, a photovoltaic module may include a first conductor positioned adjacent to a cover plate of a photovoltaic device, the conductor including a first end configured to be connected to the photovoltaic device and a second end located proximate to a connector on a first surface of the cover plate. The photovoltaic module can include a cord plate positioned on the first surface of the cover plate over the connector. The cord plate can include a base including a top surface and a bottom surface. The cord plate can be configured to be mounted to a surface of a photovoltaic module cover plate by positioning the bottom surface adjacent to the surface of the photovoltaic module. The photovoltaic module can include a junction on the top surface of the base configured to intersect a first conductor and a second conductor. The junction may include an opening formed in the base and a channel extending from the opening and configured to position the first conductor to be electrically connected to the second conductor. The photovoltaic module can include an arch adjacent to the channel configured to receive the second conductor into the channel.

The photovoltaic module can include a cradle adjacent to the arch configured to receive the second conductor into the arch. The photovoltaic module can include a conductor support adjacent to the cradle and configured to receive the second conductor into the cradle.

The conductor support can be colinear to the arch and the cradle. The arch, the cradle, and the conductor support can form a wire path from the perimeter of the base to the channel, configured to secure the second conductor and keep it straight with respect to the cord plate. A portion of the second conductor can be positioned in the channel along the wire path and an adjacent portion of the second conductor can be electrically connected to the first conductor.

The cord plate can further include a rib extending along the length of the top surface of the base, substantially perpendicular to the wire path. The cord plate can further include a second arch, a second cradle, and a second conductor support, wherein the second arch, the second cradle, and the second conductor support are colinear and define a second wire path configured to receive a third conductor into the channel at a point on the side of the channel opposite the from the first wire path, and configured to secure the third conductor and keep it straight with respect to the cord plate. The cord plate can further include a wire anchor formed in the rib, configured to secure the second conductor in a loop from the first wire path to a position adjacent and perpendicular to the second wire path. The second conductor is connected to the wire anchor such that the second conductor forms a loop from the first wire path to a position adjacent and perpendicular to the second wire path. Each arch, independently, can be a semicircle, square, rectangle or a triangle.

Some current methods of supporting the output/input wire consists of a cradle outside of the cord plate, followed by an over-arch as the stripped wire is inserted into the solder cavity. There is no support simultaneously both under and over the wire. In fact, the point at which the support transitions from under the wire to over creates a fulcrum for the wire. This can be seen as the solder tip pushes the wire down, the free wire outside the cord plate rises. It then stays that way as the sealant fills the cavity. The angle of the wire can further prevent adequate sealant flow under the wire toward the outside edge of the cord plate. The current cradle/arch design can also leave the wire vulnerable to stress (lifting) at the wire/cord plate/sealant interface. The bond between the sealant and the wire/cord plate can be broken with a force on the exposed wire loop prior to the wire tie. This can allowed moisture penetration and failures. Furthermore, the available designs allow the output/input wire to become a lever. This torque can cause the wire to pivot and limit sealant flow under the outer edge toward the wire entrance. Another consequence can be the limited sealant available to release from the cord plate allowing an electrical path.

The new design adds an additional (third) wire/cord plate support point (such as an arch) at the outer edge of the plate. These three support points will eliminate the fulcrum and keep the wire straight as it exits the cord plate. This can also free up space under the wire in the cavity allowing sealant fillage. More importantly, the wire/cord plate/sealant interface can be isolated from upward and side stresses applied to the wire loop. Wire tie can be further included to provide a stress relief point for the entire wire.

The addition of an arch conductor support, which can be an arch-shaped channel, can help orient the wire and prevent its upward pivot, and can allow sealant fillage and isolate the wire/cord plate/sealant interface from upward and side stresses applied to the wire loop. In addition, the "loop" along with wire tie location changes, will allow re-directing the wires down the sides of the cord plate parallel to the length of the module. The arch can be a semicircle, square, rectangle or a triangle.

Figure 1:
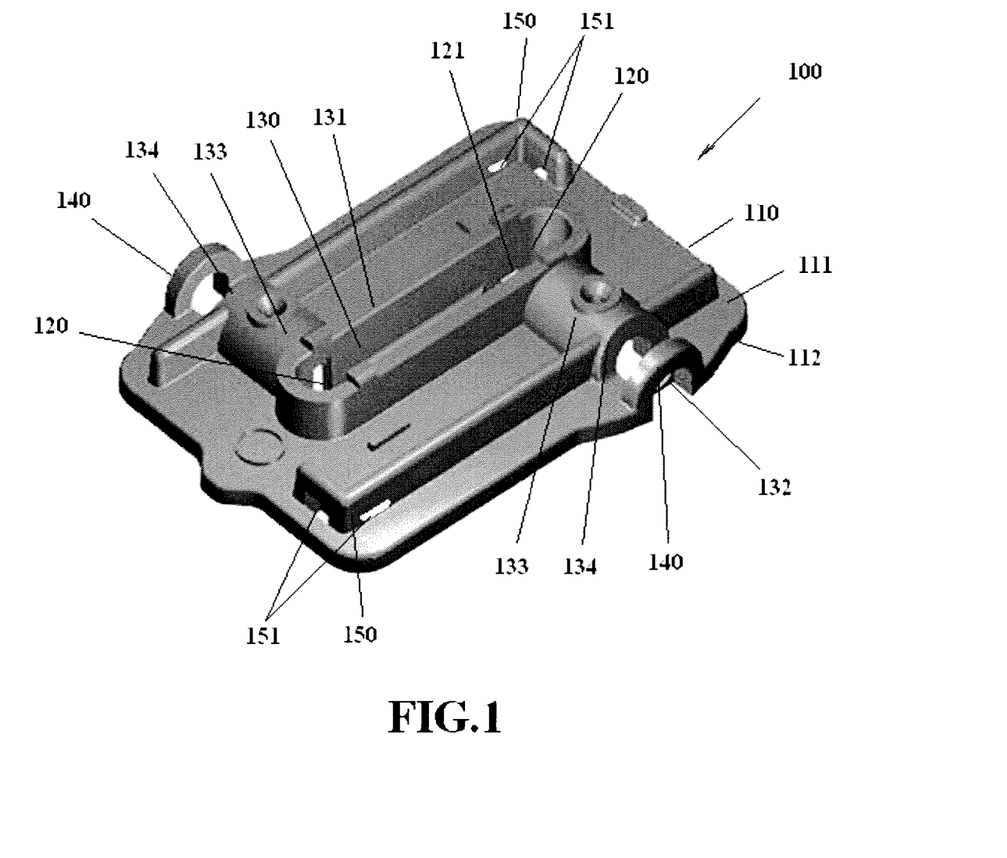
FIG. 1 is a perspective view of a cord plate.
Figure 2:
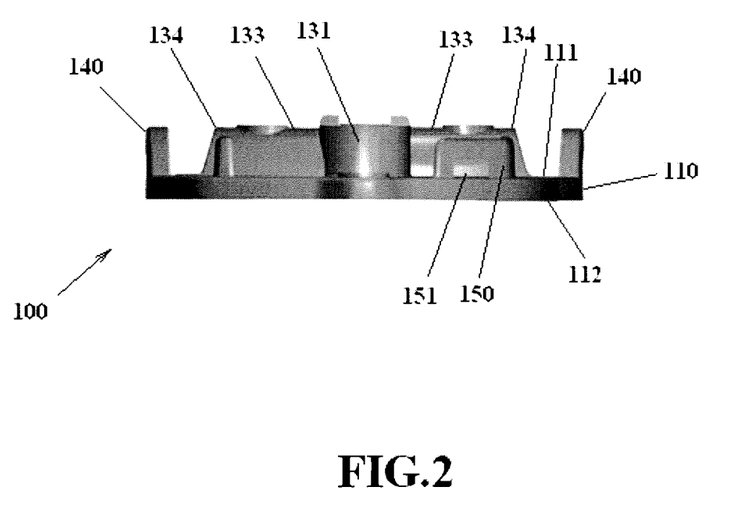
FIG. 2 is an end view of the cord plate.
Figure 3:
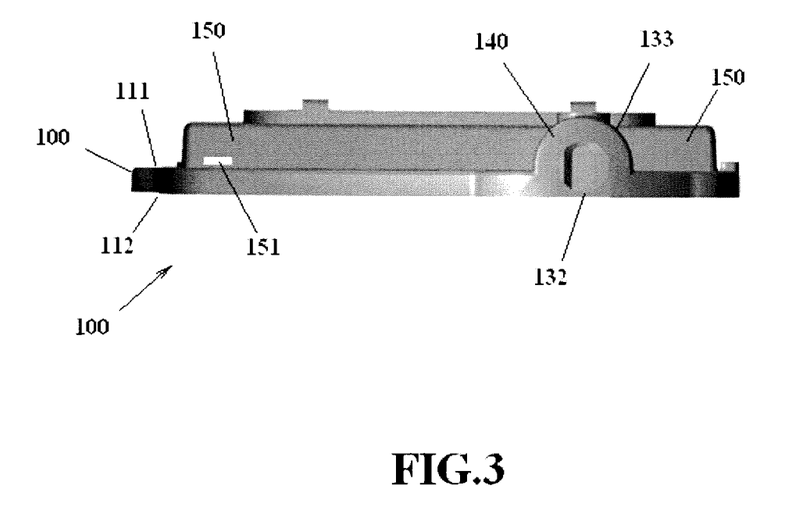
FIG. 3 is a side view of the cord plate.

Referring to FIG. 1 through FIG. 3, photovoltaic module cord plate 100 can include base 110, junction 120, and channel 130. Base 110 can include top surface 111 and bottom surface 112, wherein cord plate 100 can be configured to be mounted to a surface of a photovoltaic module cover plate by positioning bottom surface 112 adjacent to the surface of the photovoltaic module. Bottom surface 112 of base 110 can be flat. Bottom surface 112 of base 110 can be recessed. Base 110 can be rectangular or any other shape suitable for positioning and sealing cord plate 100 adjacent to the surface of the photovoltaic module. Junction 120 can be positioned within channel 130 and proximate to and/or above the top surface 111 of base 110. Junction 120 can be configured to intersect a first conductor (200 in FIGS. 4 and 5) and a second conductor (300 in FIGS. 4 and 5), wherein junction 120 can include opening 121 formed on base 110 which can allow the first conductor to be soldered to the second conductor. Base 110 can have a thickness of about 2 mm to about 10 mm. Base 110 can have a thickness of about 5 mm. The first conductor can be a lead electrically connected to the photovoltaic cells in a photovoltaic module. First conductor 200 (FIGS. 4 and 5) can be a lead foil positioned between cord plate 100 and the photovoltaic module onto which cord plate 100 is mounted.

Referring still to FIG. 1-FIG. 3, channel 130 can be configured to receive a flowable sealant, wherein channel 130 can include partition 131 extending perpendicular from top surface 111 of base 110 and encircling opening 121 to form a solder cavity. Cord plate 100 can include arch 133 adjacent to channel 130, cradle 132 adjacent to arch 133, and conductor support 140 (which can also be an arch) adjacent to cradle 133. Arch 133, cradle 132, and conductor support 140 are colinear and form a three-point support to support a second conductor along a first wire path from the exterior of cord plate 100 into channel 130. First wire path can guide and support a second conductor (such as an insulated electrical wire) into channel 130, where is can be electrically connected (for example, soldered) to the first conductor in junction 120. Arch 133 can have an inner diameter less than 3 mm greater than the diameter of the second conductor. The second conductor can enter channel 130 through opening 134 formed under arch 133. Arch 133 and conductor support 140 can extend from top surface 111 of base 110. Cradle 132 can exist in the same plane as base 110, not necessarily extending upwards like arch 133 and conductor support 140. Cord plate 100 can be made of plastic, polycarbonate, or any other suitable material. Cord plate 100 can include two groupings of arches 133, cradles 132, and conductor supports 140 to form both a first wire path and a second wire path allowing two conductors (the previously mentioned second conductor and a third conductor, for example) to be guided into channel 130. In this way, a third conductor positioned along a second wire path can be electrically connected to a fourth conductor, such as a lead foil end positioned under cord plate 100.

In some embodiments, an outside cradle can be used to replace cradle 132 shown in FIG. 1. The first conductor and the second conductor can be electrically connected by solder. The first conductor and the second conductor can also be electrically connected by conductive sealant (such as silver epoxy) or any other suitable material. The second conductor can include insulated electrical wiring configured to carry electrons either to or from the first conductor. The first conductor can include a conductive foil strip.

In some embodiments, cord plate 100 can include rib 150 extending perpendicular from top surface 111 of base 110. Rib 150 can be at the outer edge of top surface 111 of base 110 and perpendicular to the wire path formed by arch 133, cradle 132, and conductor support 140. Rib 150 can include at least one wire anchor or tie hole 151. Wire anchor or tie hole 151 can be positioned on a portion of rib 150 perpendicular to the wire path, or on a turned, terminal portion of the rib substantially parallel to the wire path.

In some embodiments, an adhesion promoter or primer can be used to alter the surface characteristics of bottom surface 112 of base 110 prior to the attachment to the photovoltaic module. This surface alteration can enhance or create a modified surface for bonding with a particular pressure sensitive adhesive. Adhesion promoter or primer can be used to raise the substrate surface energy of low surface energy material, allowing for increased short and long-term adhesion levels of acrylic foam tape adhesives. In some embodiments, bottom surface 112 of base 110 can be primed with an organo-silane primer, a water based ultraviolet (UV) primer, or any other suitable primer.

Figure 4:
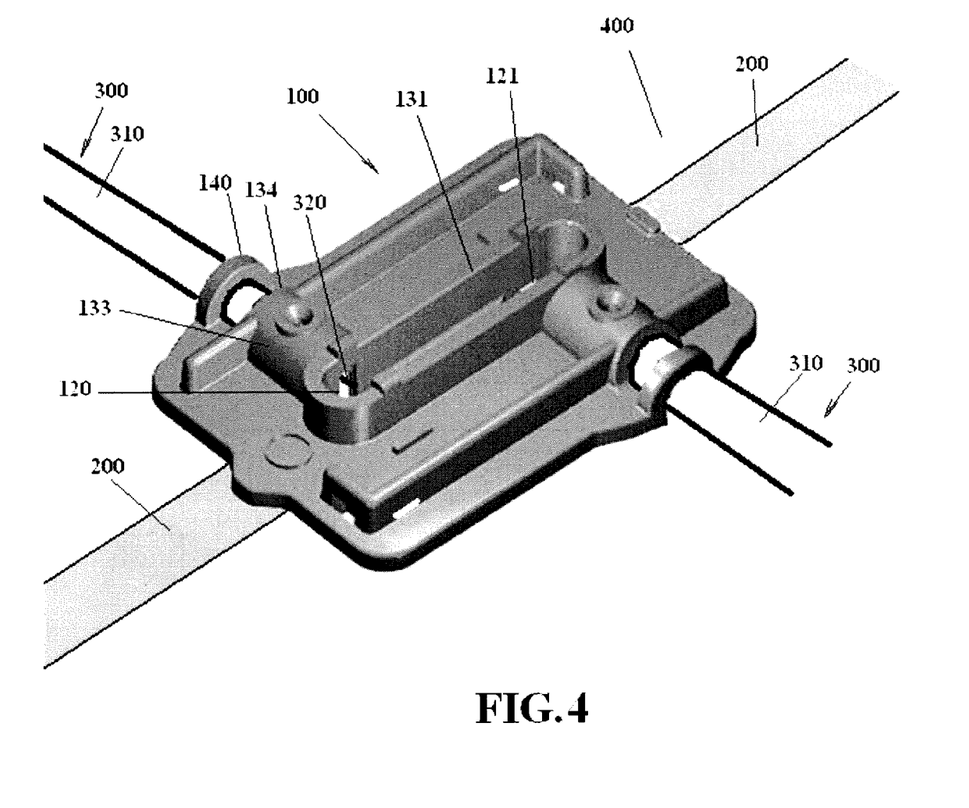
FIG. 4 is a perspective view illustrating the cord plate positioned on a cover plate of a photovoltaic module with an electrical wire secured by a three-point support.

Referring to FIG. 4, cord plate 100 can be positioned adjacent to photovoltaic module cover plate 400, with a seal optionally positioned between cord plate 100 and cover plate 400. Cord plate 100 includes junction 120, which can include opening 121 formed on base 110 of cord plate 100 and configured to position and intersect second conductor 300 with first conductor 200. Second conductor 300 can include insulated electrical wiring for carrying electrons either to or from first conductor 200, depending on whether junction 120 is a "positive" junction or a "negative" junction (cord plate 100 can include each type of junction). Second conductor 300 can include outer protective layer 310 and central conductor 320. As shown in FIG. 4, junction 120 can be used to position and secure stripped second conductor 300 or central conductor 320 of second conductor 300 proximate to first conductor 200. After they are correctly positioned, second conductor 300 and first conductor 200 can be connected, for example, by soldering. Second conductor 300 can be positioned in junction 120 either before or after cord plate 100 is positioned adjacent to cover plate 400. As shown in FIG. 4, cradle 132 (not shown in FIG. 4), arch 133, and conductor support 140 can form a three-point support to secure the second conductor.

Conductor 200 can be adjacent to cover plate 400. For example, conductor 200 can be a foil strip positioned substantially in the plane of the surface of cover plate 400. Conductor 200 can be a lead foil strip. Conductor 200 can include a first end (not shown) connected to a photovoltaic devices provided on the photovoltaic module. There can be multiple conductors 200. Conductor 200 can include a second end positioned on the surface of cover plate 400. The second end of connector 200 can be positioned proximate to opening 121 of junction 120 to be soldered to central conductor 320 of conductor 300.

Figure 5:
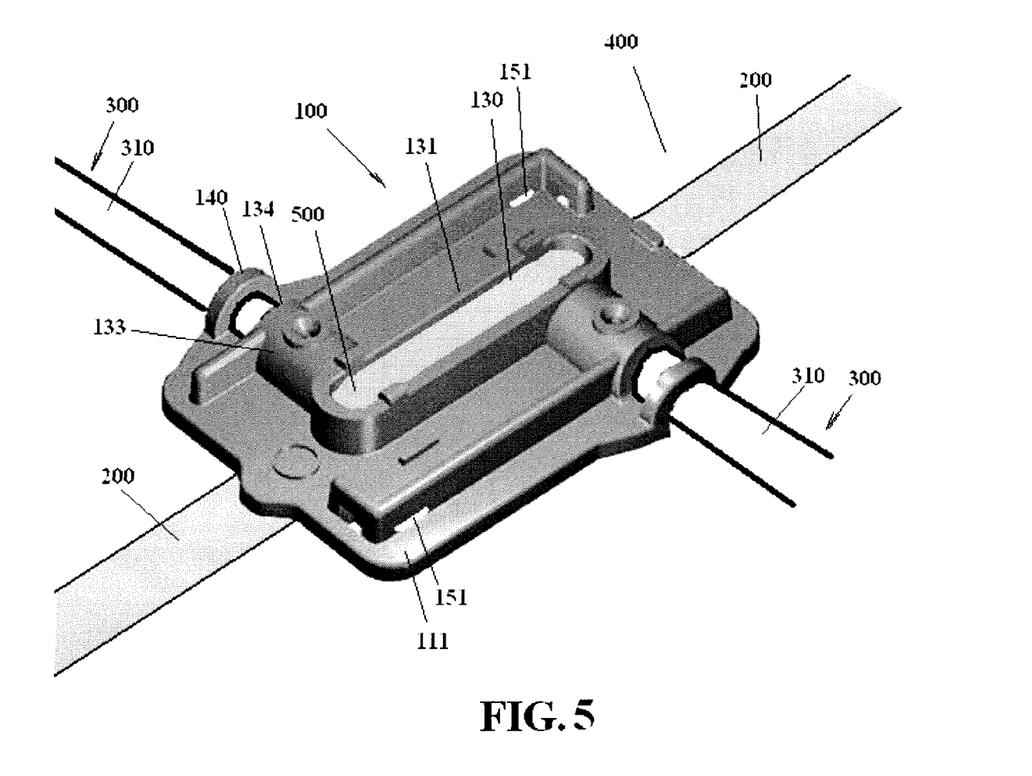
FIG. 5 is a perspective view illustrating the cord plate positioned on a cover plate of a photovoltaic module with filling a sealant to flow down from a channel of the cord plate.

Referring to FIG. 5, after second conductor 300 and first conductor 200 are connected, flowable sealant 500 is introduced into and received by channel 130 and components thereof, including solder cavity defined by partition 131 and the portion of top surface 111. Flowable sealant 500 can be any suitable sealant, including a low-viscosity sealant. Flowable sealant 500 can be a one-component sealant, a two-component sealant, or higher-component sealant. Flowable sealant can include any suitable substance, including silicone, acrylic, polysulfide, a butyl sealant, a one part or two part polyurethane sealant, or any other sealant capable of robustly sealing cord plate 100 to cover plate 400 and securing second conductor 300.

In some embodiment, flowable sealant 500 contacts channel 130, cover plate 400, and any other component in fluid communication with channel 130 into which flowable sealant 500 has been introduced. Flowable sealant 500 can include a room-temperature vulcanization sealant. Flowable sealant 500 can then cure to engage and adhere cord plate 100 and cover plate 400 and potentially other components flowable sealant contacts.

In some embodiments, flowable sealant 500 can include a room-temperature vulcanization silicone. Room-temperature vulcanizing (RTV) silicone can be constructed of reactive oil base polymers combined with strengthening mineral fillers. Flowable sealant 500 can include both two types of room-temperature vulcanizing silicone: one-component (RTV-1) and/or two-component (RTV-2). One-component RTV can harden directly under the action of atmospheric humidity. The curing process begins on the outer surface and progresses through to its core. RTV-1 silicone can have good adhesion, elasticity and durability characteristics. RTV-1 silicone can have excellent aging resistance due to superior resistance to UV radiation and weathering. RTV-2 elastomer are two-component products that, when mixed, cure at room-temperature to a solid elastomer, a gel, or a flexible foam. RTV-2 remains flexible from −80° C. to +250° C. RTV-2 can be used for electrical insulation due to its dielectric properties.

Figure 6:
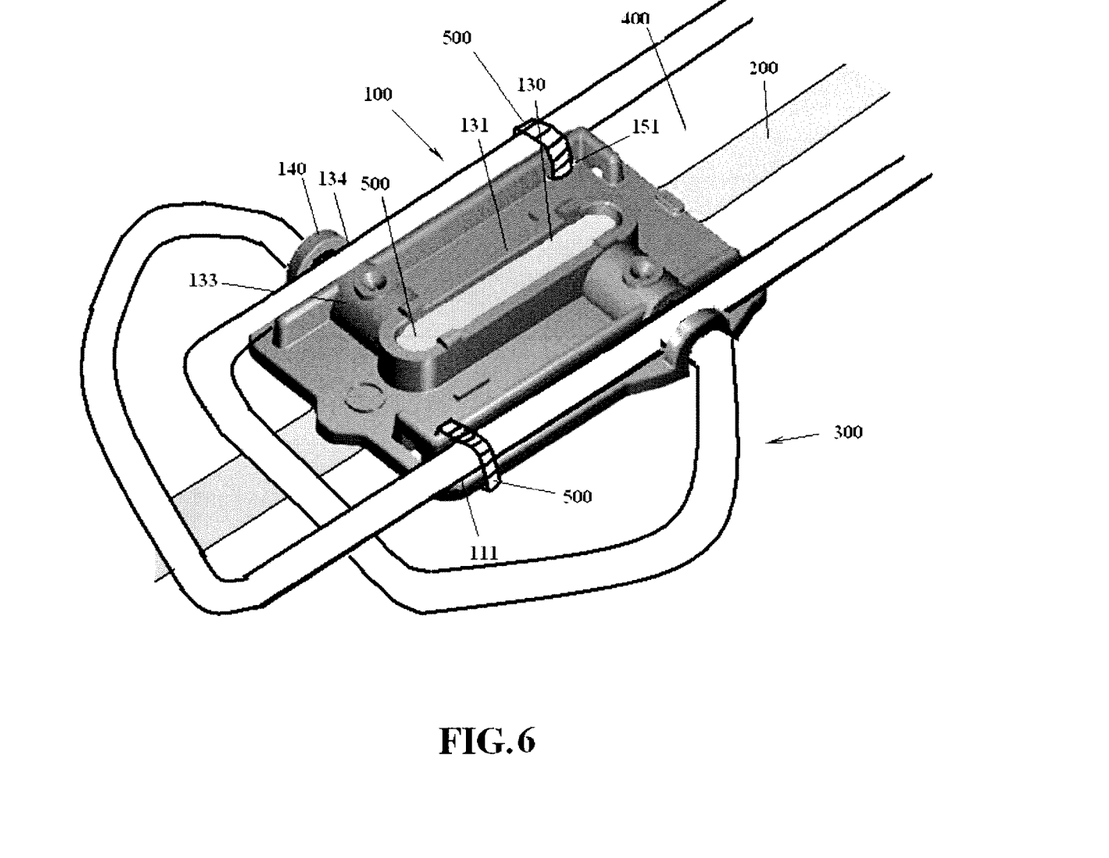
FIG. 6 is a perspective view of a photovoltaic module and cord plate.

Referring to FIG. 6, cord plate 100 can be installed on a photovoltaic module and can connect two external wires (second and third conductors 300) to two lead foil ends (first and fourth conductors 200). Second conductor 300 can lie along a first wire path defined by the second conductor's own arch 133, cradle 132, and conductor support 140. Second conductor 300 can be looped to cross adjacent and substantially perpendicular to the second wire path, on the opposite side of channel 130 and the space between the third conductor's arch 133 and conductor support 140, on the direct opposite side of cradle 132 as third conductor 300. The looped second conductor 300 can be secured in this position by connecting it to wire anchor 151 formed in rib 150 adjacent and substantially perpendicular to the second wire path. The looped second conductor 300 can be secured by tie or band 500. The third conductor 300 can be similarly secured in position to cross adjacent and substantially perpendicular to the first wire path, in the space between the second conductor's arch 133 and conductor support 140 and connected to wire anchor 151 formed in rib 150 adjacent and substantially perpendicular to the first wire path.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A photovoltaic module cord plate comprising:
   a base comprising a top surface and a bottom surface, wherein the cord plate is configured to be mounted to a surface of a photovoltaic module cover plate by positioning the bottom surface adjacent to the surface of the photovoltaic module;
   a junction on the top surface of the base configured to intersect a first conductor and a second conductor, the first conductor extending from an interior of the photovoltaic module and the second conductor being external to the photovoltaic module, wherein the junction comprises an opening formed in the bottom surface of the base and a channel extending from the opening and configured to position the first conductor to be electrically connected to the second conductor;
   an arch adjacent to the channel configured to receive the second conductor into the channel;
   a cradle adjacent to the arch configured to receive the second conductor into the arch; and
   a conductor support adjacent to the cradle and configured to receive the second conductor into the cradle, wherein the conductor support is colinear to the arch and the cradle and wherein the arch, the cradle, and the conductor support form a first wire path from the perimeter of the base to the channel, configured to secure the second conductor and keep it straight with respect to the cord plate,
   wherein the arch and the conductor support define a second wire path perpendicular to the first wire path.

2. The cord plate of claim 1, wherein the conductor support comprises a second arch extending perpendicular from the top surface of the base.

3. The cord plate of claim 2, wherein the arch comprises an inner diameter less than 3 mm greater than a diameter of the second conductor.

4. The cord plate of claim 1, wherein the top surface of the base has an outer edge and the conductor support comprises an arch extending perpendicular from the top surface's outer edge of the base.

5. The cord plate of claim 1, wherein the bottom surface of the base comprises a primer.

6. The cord plate of claim 1, wherein the channel comprises an opening in the base.

7. The cord plate of claim 1, wherein the base has a thickness of about 2 mm to about 10 mm.

8. The cord plate of claim 1, wherein the cord plate comprises plastic.

9. The cord plate of claim 1, wherein the cord plate comprises polycarbonate.

10. The cord plate of claim 1, wherein the base comprises a substantially rectangular plate.

11. The cord plate of claim 1, wherein the base comprises a recess formed in the bottom surface.

12. The cord plate of claim 1, further comprising a rib extending along the length of the top surface of the base, substantially perpendicular to the first wire path.

13. The cord plate of claim 12, further comprising a second arch, a second cradle, and a second conductor support, wherein the second arch, the second cradle, and the second conductor support are colinear and define a third wire path configured to receive a third conductor into the channel at a point on the side of the channel opposite the from the first wire path, and configured to secure the third conductor and keep it straight with respect to the cord plate.

14. The cord plate of claim 13, further comprising a wire anchor formed in the rib, wherein the third conductor is secured in the second wire path, utilizing the wire anchor, in a loop from the third wire path to a position adjacent and perpendicular to the first wire path.

15. A photovoltaic module comprising:
   a first conductor positioned adjacent to a cover plate of a photovoltaic device, the first conductor comprising a first end extending from an interior of the photovoltaic device and configured to be connected to the photovoltaic device and a second end located proximate to a connector on a first surface of the cover plate;

a cord plate positioned on the first surface of the cover plate over the connector, the cord plate comprising
a base comprising a top surface and a bottom surface, wherein the cord plate is configured to be mounted to a surface of a photovoltaic module cover plate by positioning the bottom surface adjacent to the surface of the photovoltaic module;
a junction on the top surface of the base configured to intersect the first conductor and a second conductor external to the photovoltaic device, wherein the junction comprises an opening formed in the bottom surface of the base and a channel extending from the opening and configured to position the first conductor to be electrically connected to the second conductor;
an arch adjacent to the channel configured to receive the second conductor into the channel;
a cradle adjacent to the arch configured to receive the second conductor into the arch; and
a conductor support adjacent to the cradle and configured to receive the second conductor into the cradle, wherein the conductor support is colinear to the arch and the cradle and wherein the arch, the cradle, and the conductor support form a first wire path from the perimeter of the base to the channel, configured to secure the second conductor and keep it straight with respect to the cord plate;
wherein a portion of the second conductor is positioned in the channel along the first wire path and an adjacent portion of the second conductor is electrically connected to the first conductor, and
wherein the arch and the conductor support define a second wire path perpendicular to the first wire path.

16. A photovoltaic module cord plate comprising:
a base comprising a top surface and a bottom surface, wherein the cord plate is configured to be mounted to a surface of a photovoltaic module cover plate by positioning the bottom surface adjacent to the surface of the photovoltaic module;
a junction on the top surface of the base configured to intersect a first conductor and a second conductor, the first conductor extending from an interior of the photovoltaic module and the second conductor being external to the photovoltaic module, wherein the junction comprises an opening formed in the bottom surface of the base and a channel extending from the opening and configured to position the first conductor to be electrically connected to the second conductor;
an arch adjacent to the channel configured to receive the second conductor into the channel;
a cradle adjacent to the arch configured to receive the second conductor into the arch; and
a conductor support adjacent to the cradle and configured to receive the second conductor into the cradle, wherein the conductor support is colinear to the arch and the cradle and wherein the arch, the cradle, and the conductor support form a first wire path from the perimeter of the base to the channel, configured to secure the second conductor and keep it straight with respect to the cord plate.

17. The cord plate of claim 16, wherein the conductor support comprises a second arch extending perpendicular from the top surface of the base.

18. The cord plate of claim 16, wherein the top surface of the base has an outer edge and the conductor support comprises an arch extending perpendicular from the top surface's outer edge of the base.

19. The cord plate of claim 16, wherein the channel comprises an opening in the base.

20. The cord plate of claim 16, wherein the base comprises a recess formed in the bottom surface.

21. The cord plate of claim 20, further comprising a second arch, a second cradle, and a second conductor support, wherein the second arch, the second cradle, and the second conductor support are colinear and define a third wire path configured to receive a third conductor into the channel at a point on the side of the channel opposite the from the first wire path, and configured to secure the third conductor and keep it straight with respect to the cord plate.

22. The cord plate of claim 21, further comprising a wire anchor formed in the rib, wherein the third conductor is secured in the second wire path, utilizing the wire anchor, in a loop from the third wire path to a position adjacent and perpendicular to the first wire path.

* * * * *